United States Patent
Cabral, Jr. et al.

(10) Patent No.: US 7,223,691 B2
(45) Date of Patent: May 29, 2007

(54) METHOD OF FORMING LOW RESISTANCE AND RELIABLE VIA IN INTER-LEVEL DIELECTRIC INTERCONNECT

(75) Inventors: Cyril Cabral, Jr., Ossining, NY (US); Lawrence A. Clevenger, LaGrangeville, NY (US); Timothy J. Dalton, Ridgefield, CT (US); Patrick W. DeHaven, Poughkeepsie, NY (US); Chester T. Dziobkowski, Hopewell Junction, NY (US); Sunfei Fang, LaGrangeville, NY (US); Terry A. Spooner, New Fairfield, CT (US); Tsong-Lin L. Tai, Stormville, NY (US); Kwong Hon Wong, Wappingers Falls, NY (US); Chin-Chao Yang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/965,031

(22) Filed: Oct. 14, 2004

(65) Prior Publication Data
US 2006/0084256 A1 Apr. 20, 2006

(51) Int. Cl.
H01L 21/44 (2006.01)
(52) U.S. Cl. ............ 438/659; 438/597; 438/658; 438/687; 257/E21.575

(58) Field of Classification Search ............ 438/597, 438/658, 659, 687
See application file for complete search history.

(56) References Cited

U.S. PATENT DOCUMENTS

| | | | | |
|---|---|---|---|---|
| 6,156,620 A | * | 12/2000 | Puchner et al. | 438/400 |
| 6,429,105 B1 | * | 8/2002 | Kunikiyo | 438/586 |
| 6,703,309 B1 | * | 3/2004 | Chopra | 438/659 |
| 2003/0045115 A1 | * | 3/2003 | Fang | 438/710 |
| 2003/0173671 A1 | * | 9/2003 | Hironaga et al. | 257/758 |
| 2004/0056361 A1 | * | 3/2004 | McTeer | 257/762 |

* cited by examiner

Primary Examiner—Michael Lebentritt
Assistant Examiner—Angel Roman
(74) Attorney, Agent, or Firm—Scully, Scott, Murphy & Presser, P.C.; Robert M. Trepp, Esq.

(57) ABSTRACT

A novel interlevel contact via structure having low contact resistance and improved reliability, and method of forming the contact via. The method comprises steps of: etching an opening through an interlevel dielectric layer to expose an underlying metal (Copper) layer surface; and, performing a low energy ion implant of an inert gas (Nitrogen) into the exposed metal underneath; and, depositing a refractory liner into the walls and bottom via structure which will have a lower contact resistance due to the presence of the proceeding inert gas implantation. Preferably, the inert Nitrogen gas reacts with the underlying exposed Copper metal to form a thin layer of CuN.

10 Claims, 6 Drawing Sheets

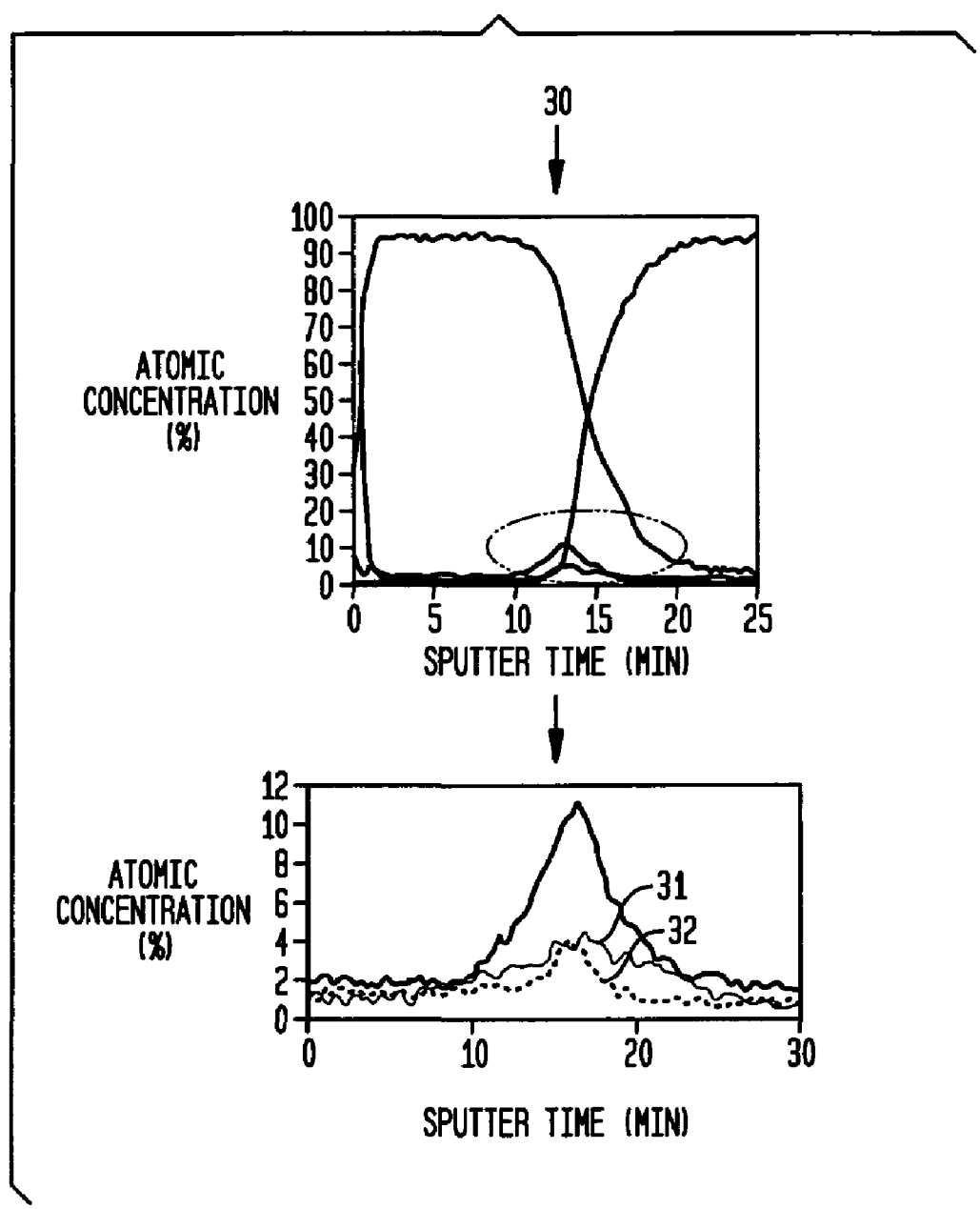

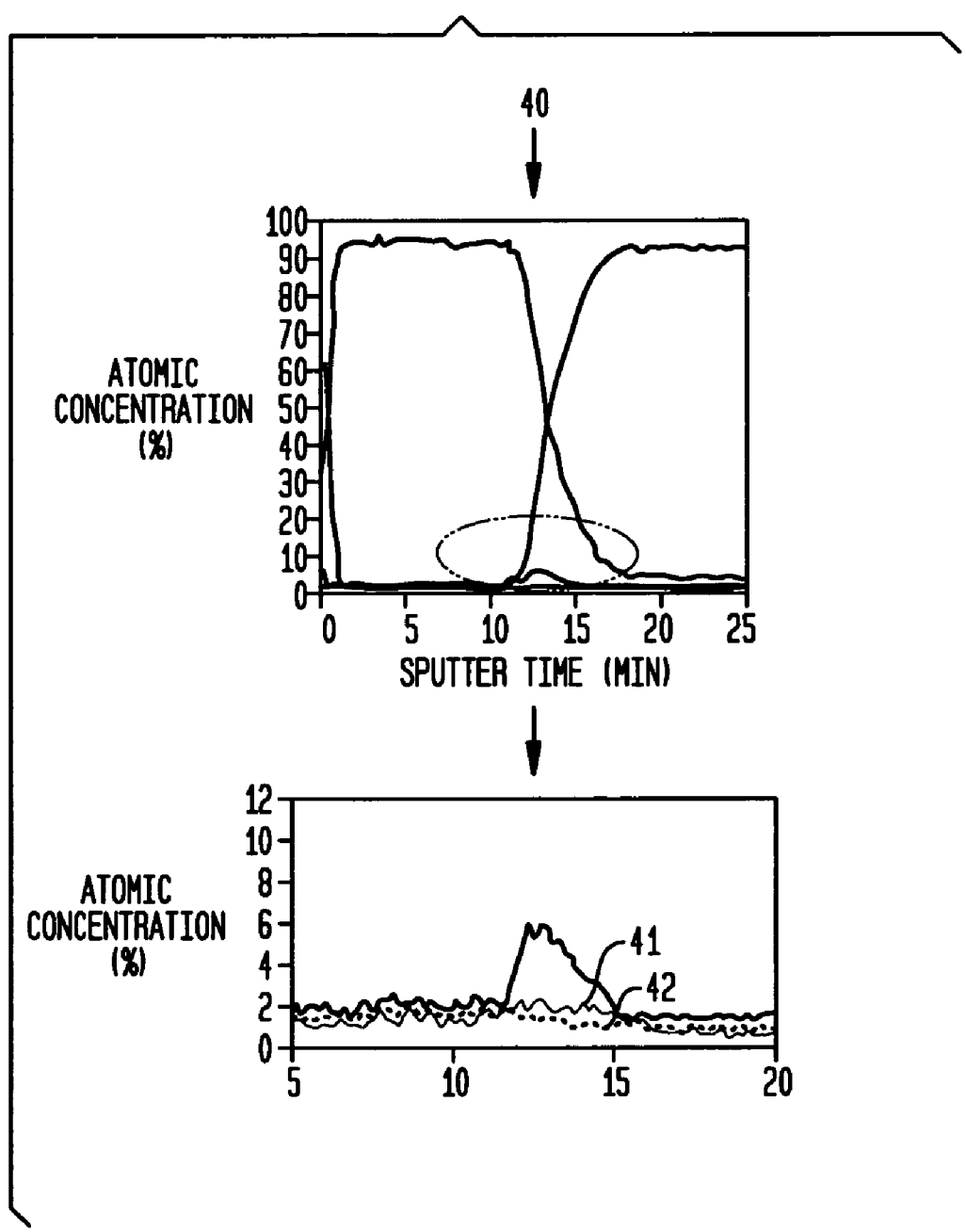

METHOD OF FORMING LOW RESISTANCE AND RELIABLE VIA IN INTER-LEVEL DIELECTRIC INTERCONNECT

FIELD OF THE INVENTION

The present invention related generally to the fabrication of semiconductor circuit devices, and more particularly to a novel method for improving the resistance and reliability of redundancy via in a copper (Cu) interconnect.

BACKGROUND OF THE INVENTION

Semiconductor devices typically include interconnects, such as vias and contacts, which connect conductive elements in non-successive layers within a semiconductor device. A via generally connects two metallic elements in different layers of a semiconductor device. A contact generally connects metallic and non-metallic conducting or semiconducting (such as silicon, polysilicon, or silicide) elements in different layers of a semiconductor device. As used herein, a "conductive" element or layer is defined to include both conducting and semiconducting elements or layers. The interconnect is typically formed in an inter-level dielectric ("ILD") layer disposed between the layers to be connected. With semiconductor technology scaling down below sub-quarter micron, interconnect delay (RC delay) becomes one of the most significant limiting factor for performance of an integrated circuit. Contact resistance of via is one of the major component in total resistance of interconnect. Thus, it is very important to reduce the contact resistance of the via. A common dielectric material used for the ILD is silicon dioxide ($SiO_2$), but more recently inorganic carbon containing material which provides lower dielectric constants (low-k), have been introduced to further reduce the RC delay of interconnect. With semiconductor technology continuously scaling down, reliability of via has become an increasingly important consideration, especially with introduction of inorganic carbon containing low-k ILD material since the low-k ILD normally has inferior mechanical properties compared to $SiO_2$.

Generally, the ILD is formed on one of the conductive layers to be connected, and a hole or trench is etched into the ILD using, for example, by plasma etching or reactive ion etching. The lower conductive layer forms the bottom of the hole. A liner may be formed in the hole, for example using physical vapor deposition, by coating the walls and floor of the hole with a diffusion barrier material, such as tungsten nitride, tantalum nitride, titanium nitride, or titanium tungsten. A plug is generally formed by depositing (e.g., using chemical vapor deposition or electroplating) conductive material (e.g., tungsten or copper) in the hole. The surface of the wafer may then be planarized, for example with chemical mechanical polishing, and then the second conductive layer to be connected is formed on the ILD. This layer is typically a metal layer, such as an aluminum alloy (e.g., aluminum copper) or copper, although it may be composed of other conductive materials.

After the hole is etched, but before the liner or plug are formed, the hole is typically cleaned (also referred to as "pre-cleaning") to remove any oxide from the surface of the lower conductive layer, as well as any other residue left from the etch chemistry used to form the hole. The cleaning may be performed with a wet etch technique, but it is generally preferable to use a dry etch process such as radio frequency ("RF") sputtering with, for example, an argon plasma, to physically etch the surface oxide. The sputter clean process of the prior art, however, may itself cause problems with the interconnect, in particular when a carbon containing low-k ILD is used. One disadvantage of the prior art is that carbon containing low-k ILD material may be dislodged from the sidewalls of the hole when plasma ions collide with the sidewalls, and then may deposit on and contaminate the lower conductive layer and increase contact resistance. Another disadvantage of the prior art is that the re-deposited carbon containing byproduct may degrade the adhesion of the liner or plug to the underlying conductive layer. In addition, the re-deposited carbon containing material may cause interconnect reliability problems, such as interconnect resistance shift during thermal stress.

A current method of cleaning an inter-level dielectric interconnect that addresses the aforementioned problems is described in co-pending Published United States Patent Application Publication No. 2003/0045115 which involves performing an anisotropic organic dielectric etch in combination with a sputter clean process.

However, even after cleaning of the via, the metal surface may further be exposed to the ambient (atmosphere or in vacuum) when the wafer is moved between the pre-clean chamber and deposition chamber for the metallization of the vias. In these instances, the metal layer adsorb contaminants from the ambient, these contaminates (i.e. oxygen, carbon) react with the top of the metal layer and create a resistive layer that hinders the electrical connectivity of the metal layer and affects the electrical contact and reliability of the vias.

In view of the foregoing, there is a need in the art for a system and method that prevents the formation of a resistive layer in metal contact via structures during processing sequences known to those skilled in the art.

It would be highly desirable to provide a manufacturing technique for the production of ILD vias in semiconductor chip designs having improved resistivity and via reliability.

SUMMARY OF THE INVENTION

This invention addresses directly a method for cleaning and passivating a conductor surface at the bottom of an interconnection via, so as to form a low resistance contact at the bottom of a via and improve the reliability of the via.

According to the invention, there is provided an improved method for forming a low resistance via contact in a multilevel interconnect semiconductor structure. The method includes etching through an inorganic ILD layer, such as carbon containing low-k (e.g., on the order of 3.5 or less) ILD layer, and exposing the underlying metal layer, low level ion implanting of nitrogen in such a method so as to concentrate nitrogen in the top level of the underlying metal layer, and depositing of a thin refractory metal line in the via. Subsequent processing includes the completion of the filling of the via with a low resistance conductor and CMP polishing to remove the excess conducting material from the top of the via.

A first aspect of the invention is directed to a method of forming the via with a low contact resistance in a semiconductor device, the method comprising the steps of: first, etching an opening through an inorganic ILD layer and cap layer to expose an underlying metal layer surface; second, performing a low energy ion implant of an inert gas into the exposed metal underneath; and third, depositing a refractory liner into the walls and bottom via structure which will have a lower contact resistance due to the presence of the proceeding inert gas implantation. Preferably, the inert gas includes Nitrogen which reacts with an underlying exposed Copper metal to form a thin layer of CuN.

A second aspect of the invention is directed to a contact structure for connecting a conducting layer formed in a semiconductor device to a subsequent conducting layer through an interlevel dielectric material. The contact structure comprises a via structure formed over the conducting layer, the conducting layer comprising a copper metal having a surface region including a concentration of implanted Nitrogen ions; and, a thin refractory metal liner material formed over the region having the concentration of implanted Nitrogen ions at a bottom of the via structure and along sidewall of the structure; and, a metal plug formed in said via structure, wherein the contact via structure exhibits improved resistivity. Preferably, the inert gas includes Nitrogen which reacts with an underlying exposed Copper metal to form a thin layer of CuN. The contact via structure exhibits improved resistivity.

Besides forming a contact structure of lower resistance, the passivation of the metal surface and formation of CuN at the location of an interlevel contact via according to the invention advantageously results in increased adhesion with the subsequently formed metal contact liner, thus improving reliability of the contact.

BRIEF DESCRIPTION OF THE DRAWINGS

The objects, features and advantages of the present invention will become apparent to one skilled in the art, in view of the following detailed description taken in combination with the attached drawings, in which:

FIG. 4 shows an exemplary Auger chemical analysis for an example contact structure formed in accordance with the present invention as compared to the prior art;

DETAILED DESCRIPTION OF THE PREFERRED EMBODIMENTS

Figure 1:
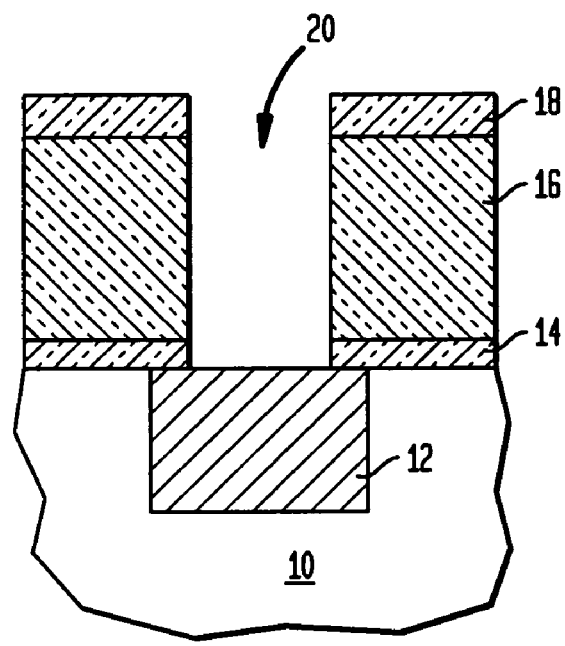
FIGS. 1–3 depicts, through cross-sectional views, respective first, second and third method steps for forming an improved low resistance contact at the bottom of a via exhibiting improved reliability of the via according to the invention.
Figure 2:
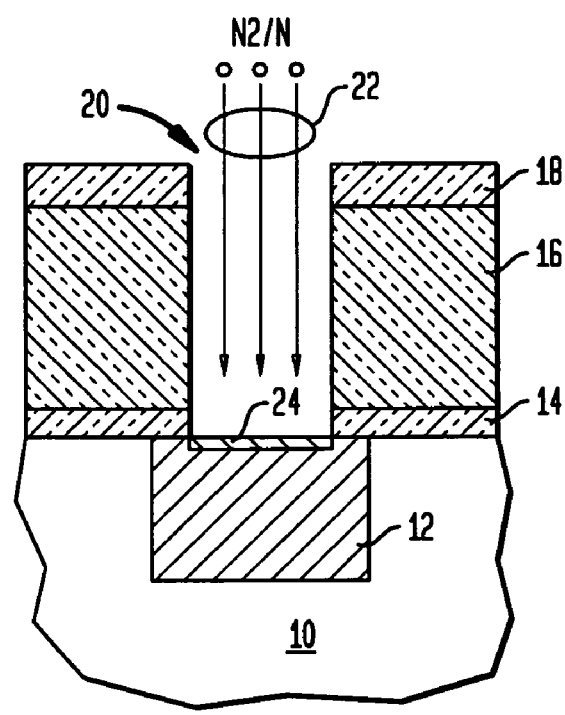
Figure 3:
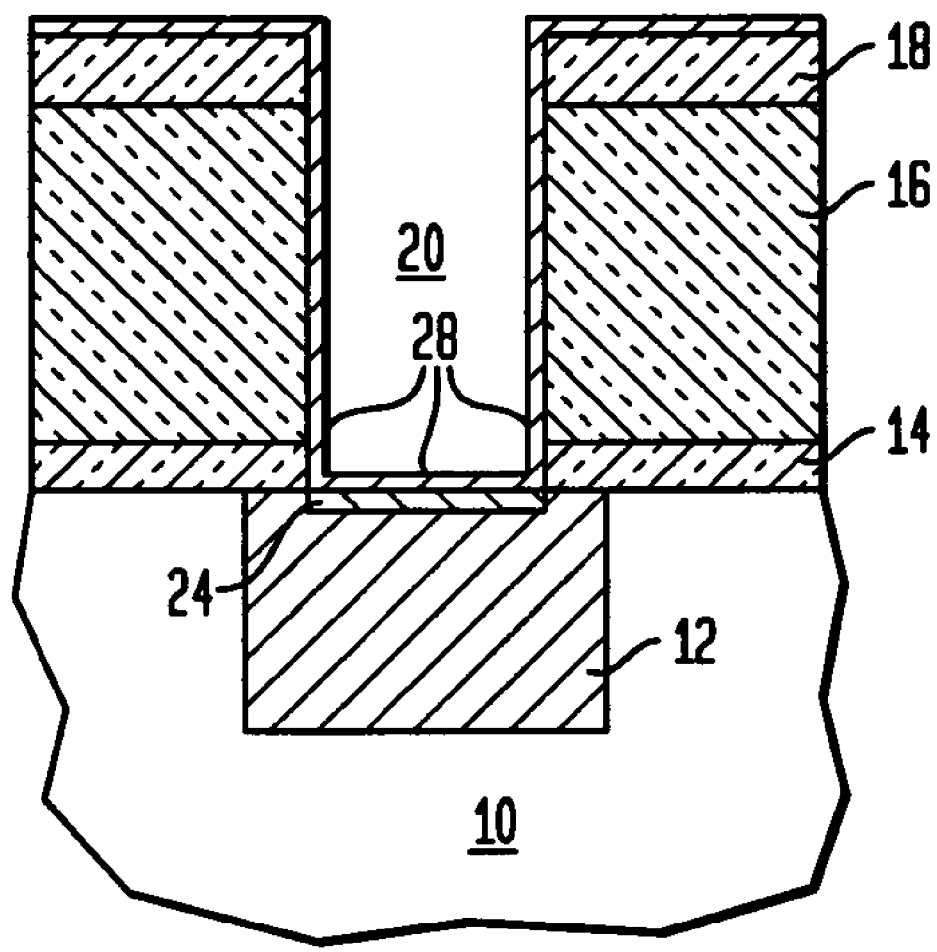

With reference to the accompanying drawings, FIGS. 1–3 illustrate schematic cross-sectional representations of methods of cleaning and passivating the Cu surface and depositing a refractory liner with a low contact resistance in at least one via of a semiconductor device according to the invention.

As shown in FIG. 1, there is provided a substrate 10 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). When the layered semiconductors are employed, the top layer of those substrates represent the top layer 10 shown in FIG. 1. Formed on substrate 10 is a representative metal layer (M1) layer 12 which may be a patterned wiring level of conducting material such as Cu, Al, or alloys thereof. Atop of the metal layer is a subsequently formed bottom dielectric capping layer 14 which may comprise silicon nitride (SiN) or silicon carbide (SiC). The formed dielectric bottom cap layer 14 may act as Cu diffusion barrier layer and also an RIE mask and CMP (chemical-mechanical polishing) polish stop layer. Atop the bottom capping layer is a low-k organic or inorganic interlevel dielectric layer (ILD) 16 of low-k dielectric material which may be deposited by any of number of well known techniques such as sputtering, spin-on, or PECVD. On top of the low-k dielectric layer is formed a top dielectric cap layer 18 comprising, for example, a hard mask layer of BLOk® (trademark of Applied Materials Inc.) and silicon nitride, to act as a moisture barrier. BLOk® is a PECVD deposited silicon carbide film. Each layer may include any now known or later developed material used for the layer's respective purpose. In one embodiment, for example, inorganic ILD layer 16 may include a single layered low-k interlevel dielectric or multilayer dielectric structure. When a multi-layered dielectric is employed as the interlevel dielectric, a buried etch stop layer may optionally be formed between the multilayered dielectrics.

Notwithstanding whether the interlevel dielectric is composed of a single layered dielectric or a multilayered dielectric, the interlevel dielectric employed may include a conventional spun-on organic dielectrics, spun-on inorganic dielectrics or combinations thereof which have a dielectric constant of about 3.5 or less. Suitable organic dielectrics that can be employed in the present invention include dielectrics that comprise C, O and H. Examples of some types of organic dielectrics that can be employed in the present invention include, but are not limited to: aromatic thermosetting polymeric resins, for example, resins sold by DOW Chemical Company under the tradename SiLK®, Honeywell under the tradename Flare®, and similar resins from other suppliers, and other like organic dielectrics. The organic dielectric employed as interlevel dielectric 16 may or may not be porous, with porous organic dielectric layers being highly preferred due to the reduced k value. When porous organic dielectrics are employed as the interlevel dielectric, the pore size of the organic dielectric is typically of from about 1 to about 50 nm at a volume percent porosity of from about 5 to about 35%. When inorganic dielectrics are employed as the interlevel dielectric, the inorganic dielectrics typically comprise Si, O and H, and optionally C, e.g., SiCOH, SiOCH, carbon-doped oxides (CDO), silicon-oxicarbides, organosilicate glasses (OSG) deposited by plasma enhanced chemical vapor deposition (CVD) techniques. Illustrative examples of some types of inorganic dielectrics that can be employed in the present invention include, but are not limited to: the silsesquioxane HOSP (sold by Honeywell), methylsilsesquioxane (MSQ), hydrido silsesquioxane (HSQ), MSQ-HSQ copolymers, tetraethylorthosilicate (TEOS), organosilanes and any other Si-containing material. In the present invention, porous or non-porous inorganic dielectrics can be used as the interlevel dielectric, with porous inorganic dielectrics being more highly preferred.

It should be recognized that the cap layers 14 and/or 18 may or may not be used. It should also be recognized that the material makeup of the layers may vary and not depart from the scope of the invention.

In the method depicted in FIG. 1, a via opening pattern is defined atop cap layer 18 followed by sequential etching of a hole or trench through the top cap layer 18, the inorganic low-k dielectric layer 16 and the bottom cap layer 14 to expose the underlying metal layer 12 to further processing (the described embodiment assumes the case of a via formed at a hole, however, it is understood that the invention is applicable for via formation at a trench or at both a hole and trench). Such steps may include first forming a mask structure and conducting a reactive ion etch (RIE) that provides superior interconnect depth control. Then, referring to FIG. 2, a next step includes the implantation of Nitrogen ions 22 into the via opening 20 to form a thin Nitrogen implanted layer 24 in the top surface of the metal conducting layer 12. In one embodiment, the energy used to implant the nitrogen 22 is less than 1 keV and the thickness of the resulting implanted layer 24 is less than about 5 nm. While a thin CuN layer 24 is formed as a result of implanting nitrogen, it is should be understood that Nitrogen may be ion implanted from a gas mixture including other atoms such as Argon or Helium. It is understood that conventional ion implantation techniques may be performed to implant the Nitrogen ions, however other techniques such as providing a plasma of a gas mixture of Nitrogen with Argon or Helium, or with a combination of Argon and Helium, or, by ion implanting performed by a plasma with RF bias or ion enhanced plasma with RF bias of between about 0 watts and about 500 watts is additionally contemplated.

Referring to FIG. 3, the next step includes the deposition of a refractory metal liner which creates a thin layer on top on the thin nitrogen implanted layer 24, on the sidewalls of the etched via opening 20 and top of the cap layer 18 or the interlevel dielectric 20 if there is no cap layer 18 present. In one embodiment, the refractory metal liner 28 comprises a refractory material, e.g., tantalum, tantalum nitride, chromium/chromium oxide, titanium, titanium nitride, tungsten, tungsten silicide, or the like, deposited using any of the known deposition methods, such as, for example, CVD, hollow cathode magnetron sputtering, deposit-etch (dep.-etch) process, or any combination of these or, other similar methods. For example, the liner material 28 may comprise a single structural compound such as TiN or TaN and deposited to a thickness of less than about 400 Å. In an alternate embodiment, the refractory metal liner(s) 28 may comprise two different structural compounds such as Ta/TaN with thicknesses of less than about 400 Å. It should be recognized that the material makeup of the metal liners 28 may vary and not depart from the scope of the invention. For example, optional liner material employed in the present invention may include any material which would prevent the diffusion of Cu into the dielectric layers. Some examples of such liners include, but are not limited to: TiN, TaN, Ti, Ta, W, WN, Cr, Nb and other like materials. The present invention also contemplates multilayer combinations of such liners. The liner material may be formed in the via utilizing conventional deposition processes well known to those skilled in the art, including: CVD, plasma-assisted CVD, sputtering, plating and chemical solution deposition. Further, as known to skilled artisans, subsequent to the formation of the liner is the deposition of a plug (usually by chemical vapor deposition or electroplating) of conductive material, e.g., Copper or Tungsten (or alloys thereof).

The implanting of low energy Nitrogen according to the invention results in the formation of a thin CuN layer at the bottom of via opening 20. The thin formed CuN protects the Cu via surface from undesirable contaminants such as Oxygen, O, and Carbon, C. It additionally improves contact via resistance and adhesion at the bottom of the via, and, further, results in a low resistance phase alpha-Ta on nitride implanted Cu surface without additional nitride (such as TaN or TiN) barrier layer.

Figure 5:
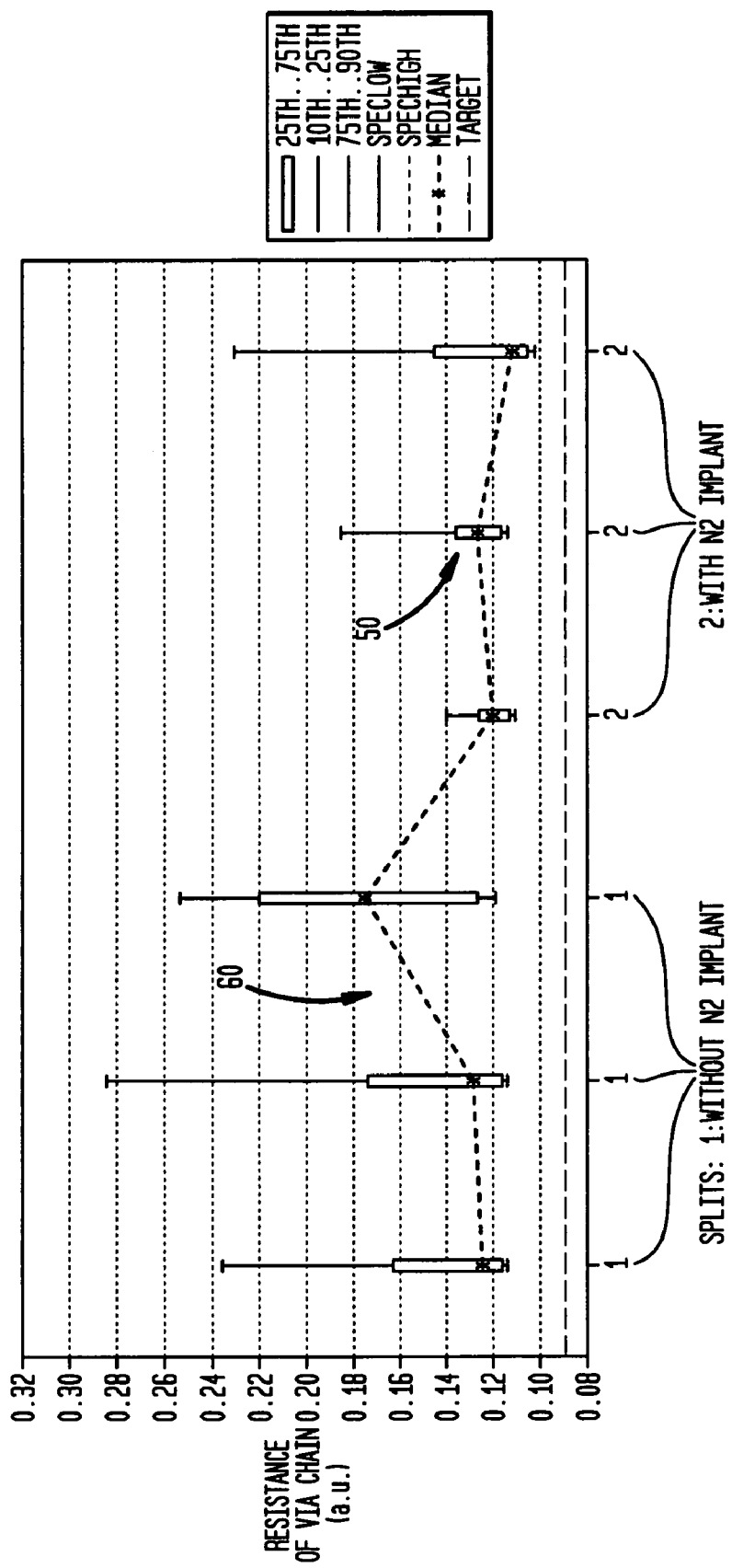
FIG. 5 illustrates the improved via contact resistance resulting from the present invention as compared to the prior art; and, FIG. 6 illustrates the crystalline structure of a via liner formed according to the present invention as compared to the prior art.

For instance, as demonstrated by the Auger chemical depth profile analysis of an example device as shown with respect to FIGS. 4(a) and 4(b), the implantation of nitrogen into the metal conducting line 12 results in a cleaner metal liner 28/metal conducting line 12 interface. The Auger chemical depth profile analysis 30 depicted in FIG. 4(a) is obtained at the metal liner/metal surface interface of the contact region without the formed Nitrogen implant and illustrates the resulting concentrations of C and O contamination 31, 32 respectively, resulting from the interlevel contact formation process. This is compared to the Auger chemical depth profile analysis 40 depicted in FIG. 4(b) is obtained at the metal liner/metal surface interface of the contact region with the formed CuN layer and illustrates resulting concentrations of C and O contamination 41, 42 respectively, of significantly reduced concentrations (no peaks shown, i.e. the amount of contamination is under Auger detection limit). Thus, there is manifest a lower via 20 contact resistance 50 as exemplified in FIG. 5 for the nitrogen implanted surface of the metal conducting line 12 as compared to the via contact resistance 60 without the N implant.

Figure 6:
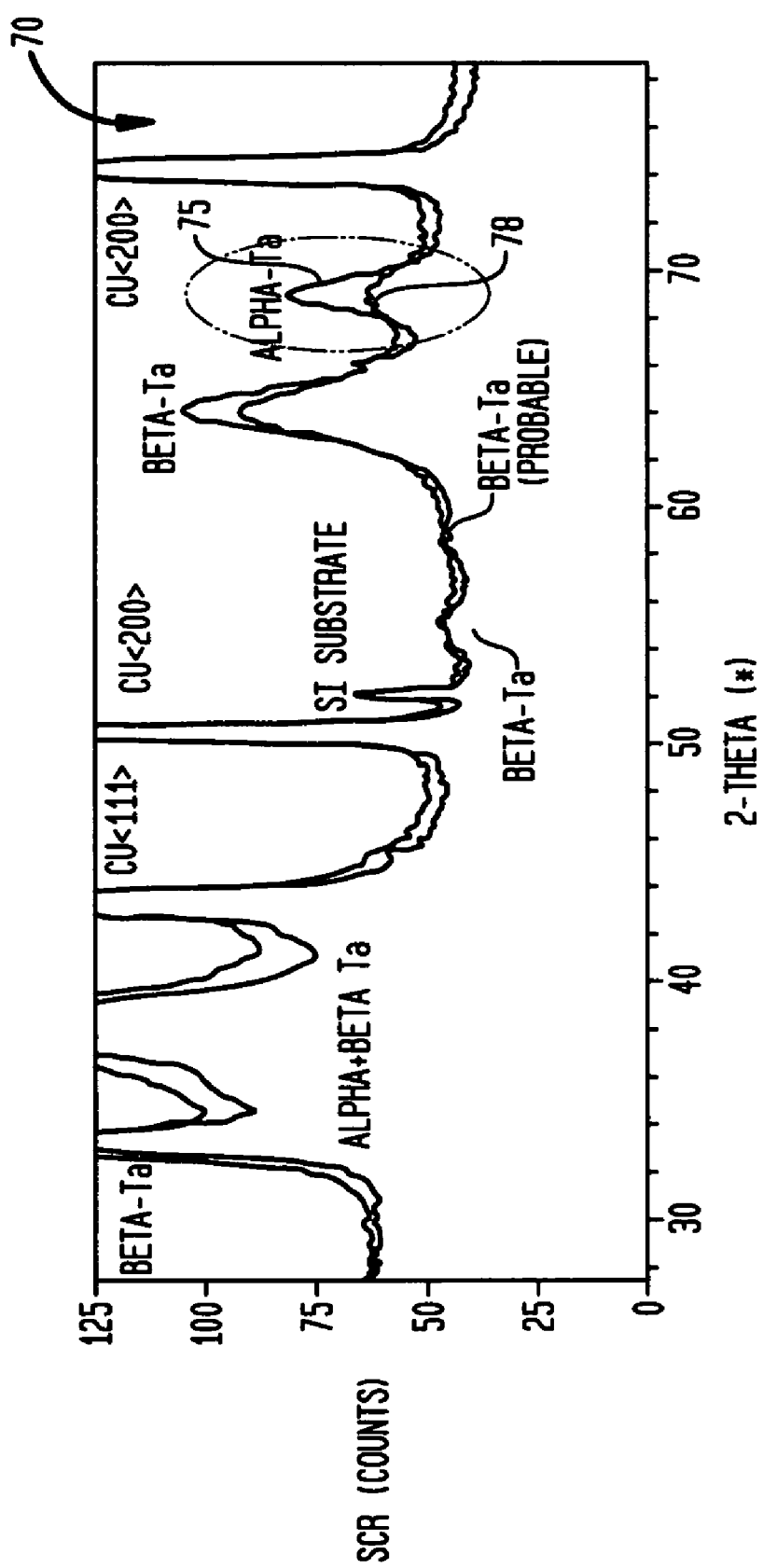

Moreover, as a result of the passivation of the metal surface according to the invention, a lower resistance alpha phase Ta ($\alpha$-Ta) is preferably formed in the metal liner 28 that increases the reliability performance of the formed interconnection structure. As known, $\alpha$-Ta has a body centered cubic crystal structure as compared to a Beta phase Ta $\beta$-Ta possessing a tetragonal crystal structure and exhibiting roughly ten (10) times more sheet resistivity. Thus, as shown in FIG. 6, there is depicted the crystalline structures 70 of a Tantalum metal liner formed on the CuN metal layer surface having an increased $\alpha$-Ta phase 75 according to the present invention as compared to a Tantalum liner formed on the Cu metal layer surface having a reduced $\alpha$-Ta phase 78 according to the prior art e.g., implementing an Argon sputter clean. As is shown in FIG. 6, the nitrogen enriched metal conductor CuN surface enables the formation of a tantalum layer in the desired low-resistivity alpha phase, thus minimizing the resistivity of the contact.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new is:

1. A method of improving contact resistance of a via opening formed in a low-k inter-level dielectric (ILD) layer to expose an underlying metal layer of Cu or alloys thereof, the method comprising:

etching through said low-k ILD layer to form said via opening that exposes the underlying Cu metal layer, ion implanting Nitrogen at energies of less than 1 keV at a bottom of said via hole so as to concentrate Nitrogen at a surface of the underlying Cu metal layer and form a layer of CuN at a surface of said exposed Cu metal layer; and, depositing a thin refractory metal liner along a bottom and sidewall of said etched via opening, said formed layer of CuN enabling formation of a subsequent refractory metal liner having a reduced resistivity alpha-phase, wherein said ion implanting Nitrogen at energies of less Than 1 keV improves resistivity of a formed contact comprising the metal liner and said Cu metal layer.

2. The method as claimed in claim 1, wherein said ion implanting Nitrogen at energies of less than 1 keV improves via reliability.

3. The method as claimed in claim 1, wherein a thickness of the resulting formed CuN layer is less tan about 5 nm.

4. The method as claimed in claim 1, wherein said ILD is a low-k organic ILD layer.

5. The method as claimed in claim 1, wherein said ILD is a low-k inorganic ILD layer.

6. The method as claimed in claim 1, further comprising steps of filling of the via with a low resistance conductor; and, polishing a surface of the conductor to remove excess conducting material from the top of the via.

7. The method of claim 1, wherein said ion implantation of Nitrogen includes subjecting said opening to a mix of inert gases including Nitrogen in combination with Argon or Helium, or Argon and Helium.

8. The method of claim 1, wherein said ion implantation is performed by plasma of a gas mixture of Nitrogen in combination with Argon or Helium, or Argon and Helium.

9. The method of claim 8, wherein said ion implantation is performed by plasma with RF bias of between about 0 watts and about 500 watts.

10. The method of claim 8, wherein said ion implantation is performed with ion enhanced plasma with an RF bias of between about 0 watts and about 500 watts.

* * * * *